United States Patent [19]
Sredanovic et al.

[11] Patent Number: 6,084,803
[45] Date of Patent: Jul. 4, 2000

[54] INITIALIZATION OF NON-VOLATILE PROGRAMMABLE LATCHES IN CIRCUITS IN WHICH AN INITIALIZATION OPERATION IS PERFORMED

[75] Inventors: Nikolas Sredanovic; Helena Calendar, both of Mountain View, Calif.

[73] Assignee: Mosel Vitelic, Inc., Hsin Chu, Taiwan

[21] Appl. No.: 09/178,197

[22] Filed: Oct. 23, 1998

[51] Int. Cl.[7] .................................................. G11C 16/04
[52] U.S. Cl. ............................. 365/189.05; 365/225.7; 365/233
[58] Field of Search ........................... 365/189.05, 233, 365/230.06, 225.7; 395/651, 652

[56] References Cited

U.S. PATENT DOCUMENTS

| | | | |
|---|---|---|---|
| 4,387,503 | 6/1983 | Aswell et al. | 29/575 |
| 4,404,635 | 9/1983 | Flaker | 364/481 |
| 4,532,402 | 7/1985 | Overbeck | 219/121 LU |
| 4,532,607 | 7/1985 | Uchida | 365/96 |
| 4,546,455 | 10/1985 | Iwahashi et al. | 365/200 |
| 4,614,881 | 9/1986 | Yoshida et al. | 307/219 |
| 4,617,651 | 10/1986 | Ip et al. | 365/200 |
| 4,725,979 | 2/1988 | Hoberman | 365/96 |
| 4,771,285 | 9/1988 | Agrawal et al. | 340/825 |
| 4,779,229 | 10/1988 | Agrawal | 365/94 |
| 4,837,520 | 6/1989 | Golke et al. | 324/550 |
| 4,852,044 | 7/1989 | Turner et al. | 364/900 |
| 4,943,804 | 7/1990 | Lee et al. | 340/825 |
| 5,066,998 | 11/1991 | Fischer et al. | 357/51 |
| 5,086,331 | 2/1992 | Hartgring et al. | 357/51 |
| 5,134,585 | 7/1992 | Murakami et al. | 365/200 |
| 5,185,291 | 2/1993 | Fischer et al. | 437/173 |
| 5,285,953 | 2/1994 | Tsujimoto | 365/200 |
| 5,440,246 | 8/1995 | Murray et al. | 326/38 |
| 5,459,684 | 10/1995 | Nakamura et al. | 365/149 |
| 5,497,355 | 3/1996 | Mills et al. | 365/230.08 |
| 5,506,638 | 4/1996 | Cowles et al. | 326/38 |
| 5,526,320 | 6/1996 | Zagar et al. | 365/233.5 |
| 5,544,124 | 8/1996 | Zagar et al. | 365/230.08 |
| 5,566,107 | 10/1996 | Gilliam | 365/200 |
| 5,640,364 | 6/1997 | Merritt et al. | 365/233.5 |
| 5,710,741 | 1/1998 | McLaury | 365/226 |
| 5,793,688 | 8/1998 | McLaury | 365/203 |
| 5,812,489 | 9/1998 | Matsui | 365/233 |
| 5,870,342 | 2/1999 | Fukuda | 365/201 |
| 5,898,621 | 4/1999 | Takahashi et al. | 365/185.33 |

FOREIGN PATENT DOCUMENTS 288 689   10/1983   Germany.

OTHER PUBLICATIONS

B. Prince, "High Performance Memories" New Architecture DRAMs and SRAMs Evolution and Function, 1996, pp. 135–227.

B. Prince, "Semiconductor Memories" A Handbook of Design, Manufacture and Application, Second Edition, (1991), pp. 762–764.

"Synchronous Graphics RAM" Micron Technology, Inc. of Boise Idaho, 1998, pp. 1–45.

*Primary Examiner*—David Nelms
*Assistant Examiner*—Gene N. Auduong
*Attorney, Agent, or Firm*—Skjerven Morrill MacPherson Franklin & Friel LLP; Barmak S. Sani

[57] ABSTRACT

A non-volatile programmable latch (110) in an integrated circuit (310) is initialized by an initialization signal (SET). At least a portion of the initialization signal is generated in response to a command to the circuit to perform a circuit initialization operation. In some embodiments, the circuit is a synchronous dynamic random access memory (SDRAM), or a synchronous graphics random access memory (SGRAM). The command is a mode register set command (MRS). The command is received when a predetermined period of time has elapsed after power was turned on. Waiting for the predetermined period of time before initializing the latch allows the voltage powering the latch to develop so that the latch can be initialized reliably.

30 Claims, 4 Drawing Sheets

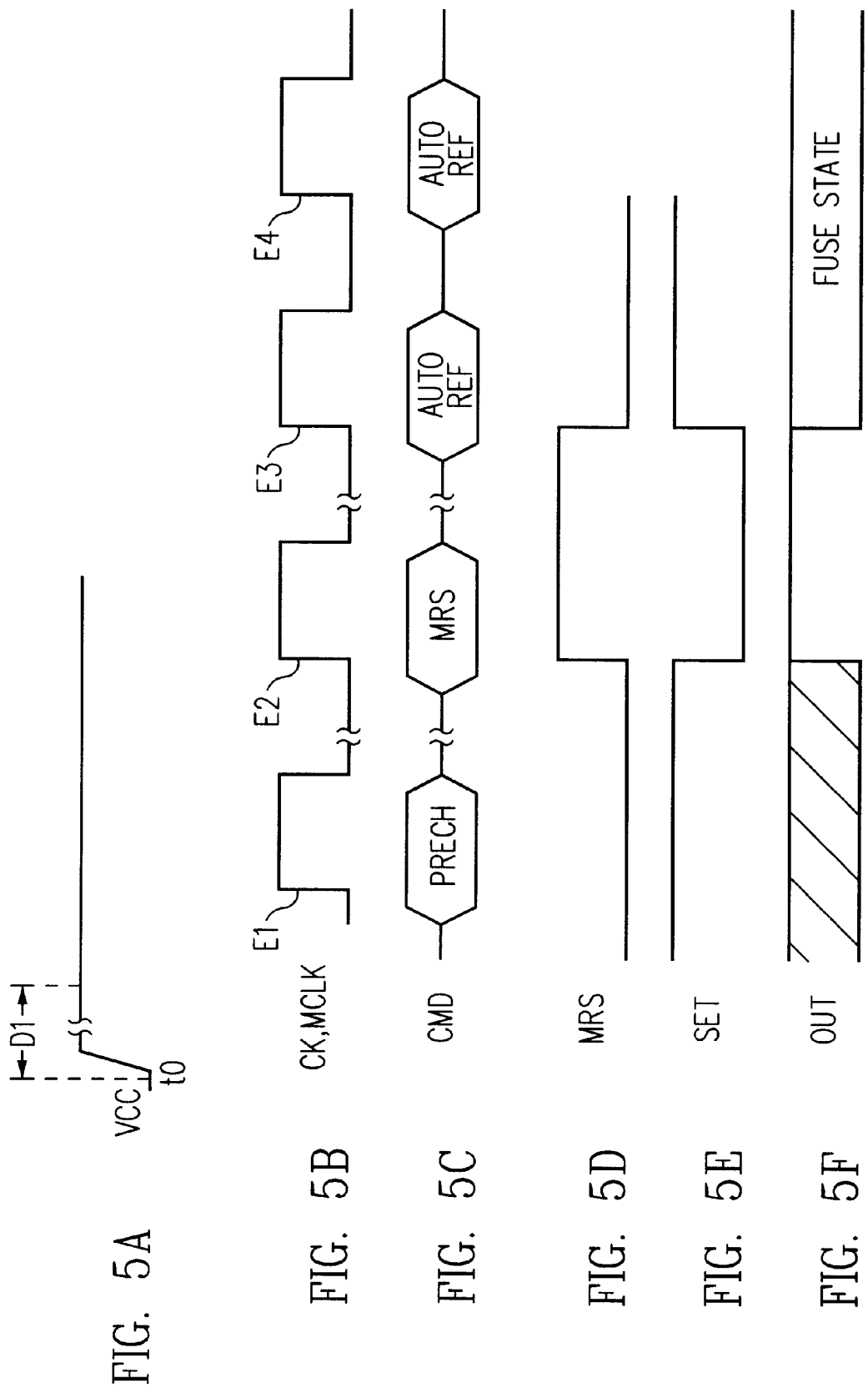

6,084,803

INITIALIZATION OF NON-VOLATILE PROGRAMMABLE LATCHES IN CIRCUITS IN WHICH AN INITIALIZATION OPERATION IS PERFORMED

CROSS-REFERENCE TO RELATED APPLICATIONS

Not applicable.

STATEMENT REGARDING GOVERNMENT SPONSORED RESEARCH

Not applicable.

BACKGROUND OF THE INVENTION

The present invention relates to initialization of non-volatile programmable latches.

Non-volatile programmable latches enable one to modify an integrated circuit without changing the fabrication masks. FIG. 1 illustrates one such latch 110 used to modify an integrated memory by replacing defective memory cells with spare memory cells. In latch 110, laser-programmable fuse F1 has one terminal connected to the drain of NMOS transistor 114 whose source is connected to ground. The other terminal of fuse F1 is connected to terminal 120 also connected to the drain of PMOS transistor 130. The source of transistor 130 is connected to power supply voltage VCC. The gates of transistors 130 and 114 are connected to the latch initialization input SET.

Terminal 120 is connected to the input of CMOS inverter 140 whose output OUT is connected to the gate of PMOS transistor 150. The source of transistor 150 is connected to power supply voltage VCC, and the drain to terminal 120.

The output OUT of inverter 140 is connected to memory decoders (not shown) that control selection of regular and spare memory cells.

The latch is initialized by a positive edge of signal SET. The input SET is initially kept at ground when the power is turned on. Consequently, transistor 130 pre-charges the terminal 120 to VCC. Then the input SET is driven high, turning off transistor 130 and turning on transistor 114. If the fuse F1 is intact, transistor 114 overpowers transistor 150 and drives the terminal 120 to ground. Inverter 140 shuts off transistor 150, latching the output OUT in the high voltage state.

If the fuse F1 has been blown, the terminal 120 remains high when SET becomes high. The output OUT remains low. Transistor 150 remains on, maintaining the high voltage on terminal 120.

The signal SET is generated by power up circuit 204 illustrated in FIG. 2. The input SET is connected to the output PU of the power up circuit. PMOS transistor 210 of the power up circuit is connected between power supply VCC and a terminal 220. The gate of transistor 210 is grounded. Four inverters 224, 230, 234, 240 are connected in series between the terminal 220 and the output terminal PU to provide a delay on output PU at power up. Additional delay is provided by capacitor 250 connected between terminal 220 and ground.

Initially when the power is turned on, signal PU remains low for a while due to the delay provided by the inverters and the capacitor. During the delay the voltage VCC develops and allows transistor 130 (FIG. 1) to charge the terminal 120 to a high voltage. Also during this delay, transistor 150 turns on.

When the delay ends, the input SET is driven high by inverter 240, allowing the output OUT to assume a voltage indicating the state of fuse F1.

Disadvantageously, the latch may operate improperly if VCC rises slowly during power up. Indeed, if VCC rises slowly, the output PU will almost track VCC. Therefore, transistor 130 may never turn on, or at least it may never turn on sufficiently strongly or for a sufficient period of time to charge the terminal 120 to a high voltage. Consequently, if the fuse F1 is blown, the terminal 120 can get stuck at some intermediate voltage between VCC and ground, and so can the output OUT.

It is desirable to provide more reliable latch initialization.

SUMMARY

Some embodiments of the present invention provide more reliable latch initialization. In some embodiments, the latch is used in a memory that has to perform an initialization operation before the memory can be accessed. Examples of such memories are SGRAMs (Synchronous Graphics Random Access Memories). An SGRAM operates by performing commands when command signals are received on memory terminals. The commands include memory access commands such as read and write, and in addition the commands include a Mode Register Set (MRS) command that initializes a mode register of the memory. (The mode register is initialized by being written with the burst length and some other parameters.) The low level of the latch initialization signal SET is generated from the MRS command signal received on the memory terminals. The high level is generated when the MRS command has been removed from the memory terminals and another command has been supplied.

SGRAM data sheets typically specify that a certain period of time must elapse after the power is turned on before the MRS command can be performed. During that period of time, the power supply voltage typically reaches its final value. Therefore, the latch initialization signal SET can be generated reliably when the MRS command is received by the memory.

The present invention is not limited to SGRAMs or memories. In some embodiments, a non-volatile programmable latch controls a circuit which may or may not include a memory. The circuit is initialized by at least one initialization operation. The initialization operation is performed when an appropriate signal, say, a signal S, is received on one or more terminals. (The signal S may or may not be the MRS command signal.) The terminal(s) receiving the signal S can also receive other signals in response to which the circuit performs one or more other operations. At least a portion of the latch initialization signal is generated in response to the signal S.

Other features and advantages of the invention are described below. The invention is defined by the appended claims.

BRIEF DESCRIPTION OF THE DRAWINGS

FIG. 5, consisting of FIGS. 5A–5F, is a set of timing diagrams illustrating the operation of the circuits of FIGS. 3 and 4.

DESCRIPTION OF PREFERRED EMBODIMENTS

Figure 1:
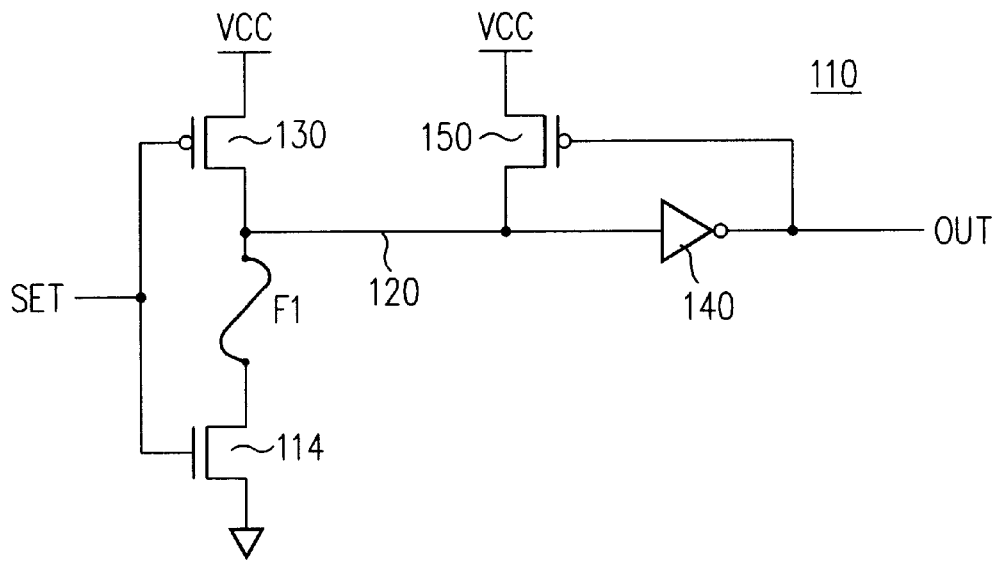
FIG. 1 is a circuit diagram of a prior art programmable latch.
Figure 3:
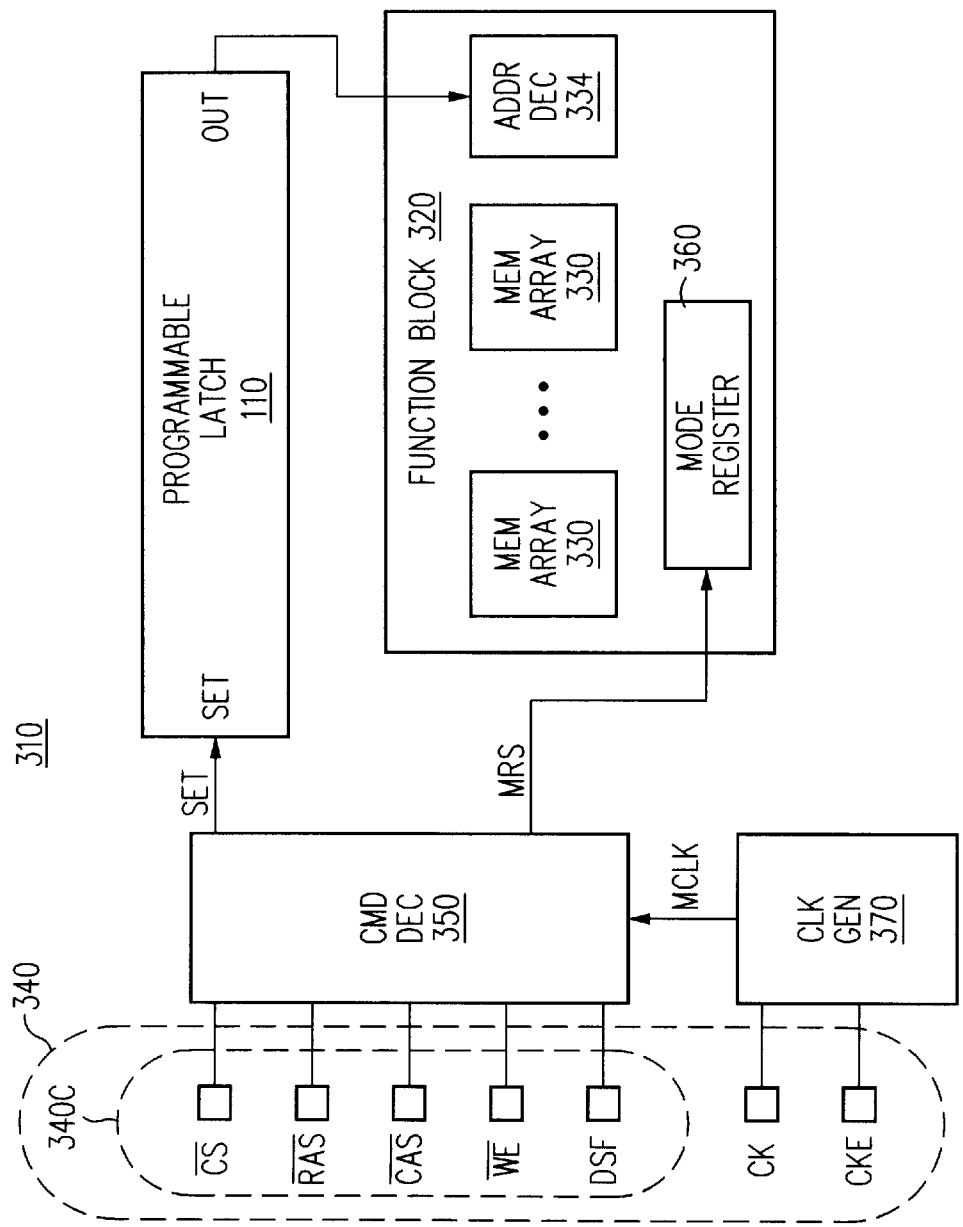
FIG. 3 is a block diagram illustrating one embodiment of a circuit that performs latch initialization according to the present invention.

FIG. 3 illustrates an integrated circuit 310 having a non-volatile programmable latch 110. In some embodiments, latch 110 is identical to the prior art latch of FIG. 1. However, the initialization signal SET in FIG. 3 is generated more reliably as described below.

Latch 110 controls a function block 320. In the embodiment of FIG. 3, block 320 includes one or more dynamic random access memory (DRAM) arrays 330, memory address decoders 334, and possibly other circuitry (not shown) used to access the memory arrays. Circuit 310 is an integrated synchronous graphics random access memory (SGRAM). SGRAMs are synchronous DRAMs (SDRAMs) enhanced by graphics features. SGRAMs are described, for example, in B. Prince, "High Performance Memories" (1996), pages 135–227 incorporated herein by reference. See also NEC document No. M10235EJ2V0DSU1 (NEC Corporation), incorporated herein by reference, describing an SGRAM of type μPD481850 (Trademark) available from NEC Corporation. See also "Synchronous Graphics RAM" (Micron Technology, Inc. of Boise, Id., May 1998), incorporated herein by reference, describing an SGRAM MT41LC256K32D4 (Trademark). In some embodiments, memory 310 is a non-graphics SDRAM. SDRAMs are described in B. Prince, "High Performance Memories", (1996), pages 135–182 incorporated herein by reference.

Memory 310 is responsive to commands on terminals 340 to perform read and write operations on memory arrays 330. The commands are decoded by command decoder 350.

In some embodiments, the terminals 340 are external pins of integrated circuit 310. In other embodiments, one or more of terminals 340 are internal terminals of the integrated circuit.

When circuit 310 has been powered up, one or more initialization operations have to be performed before the memory arrays 330 can be read or written. One such initialization operation is a command "Mode Register Set" (MRS) which initializes a mode register 360 in function block 320. The MRS command writes the mode register with parameters such as $\overline{\text{CAS}}$ latency, burst length, and others. See, for example, B. Prince, "High Performance Memories" (1996), pages 150–154, incorporated herein by reference. In response to the MRS command signal on terminals 340, command decoder 350 generates a signal MRS which causes the mode register 360 to be written with values provided on memory address pins (not shown).

The MRS command is performed before the function block 320 can perform any operation that depends on the state of programmable latch 110. Therefore, the latch 110 can be initialized in response to the MRS command signal on terminals 340. In particular, the low level of the SET signal is generated in response to the MRS command. The high level of the SET signal is generated when another, non-MRS, command signal is supplied to terminals 340.

Memory data sheets typically specify a minimum period of time that must elapse before the MRS command can be performed. For example, the data sheet for the aforementioned NEC memory of type μPD481850 states that 100 μs must elapse after power up, then a precharge command must be performed to precharge the memory banks, and only then the MRS command can be performed. Thus, before the MRS command is performed, the power supply voltage VCC has typically reached its final value or at least has become sufficiently high to enable reliable initialization of latch 110.

While in FIG. 3 the MRS signal is shown delivered directly to mode register 360, in some embodiments the MRS signal is delivered to other circuitry that controls the mode register and is not necessarily delivered directly to the mode register, as is known in the art. Similarly, in some embodiments, the output OUT of latch 110 is connected to address decoders 334 through other circuitry (not shown), as known in the art.

We will now describe the FIG. 3 SGRAM embodiment in more detail. In FIG. 3, terminals 340 include clock terminal CK, clock enable terminal CKE, and five terminals labeled as 340C which are terminals $\overline{\text{CS}}$ (chip select), $\overline{\text{RAS}}$ (row address strobe), $\overline{\text{CAS}}$ (column address strobe), $\overline{\text{WE}}$ (write enable), and DSF (designated special function). Clock generator 370 receives the clock signal CK and clock enable signal CKE and generates an internal clock signal MCLK for decoder 350. If clock enable CKE is high for a predetermined period of time (CKE set up time) immediately before a rising edge of clock CK, then MCLK will have a rising edge on the next rising edge of clock CK. The CKE timing is described in more detail in "High Performance Memories", cited above, at pages 160–162 incorporated herein by reference. In any event, MCLK starts to be generated no later than the third rising CK edge after CKE goes high. Clock generators 370 are known in the art.

Figure 4:
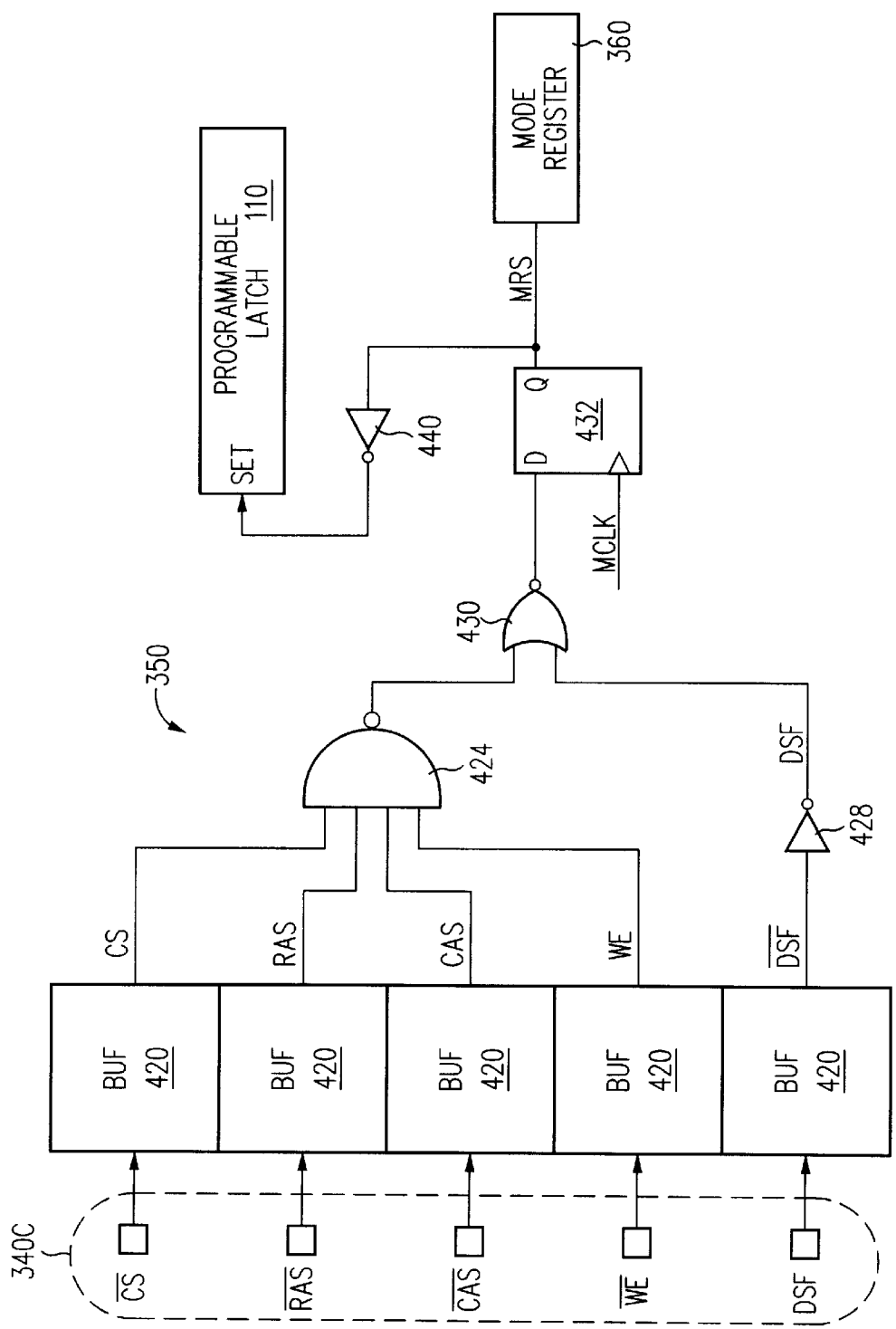
FIG. 4 is a block-and-circuit diagram illustrating some features of the circuit of FIG. 3.

FIG. 4 shows pertinent details of command decoder 350. Input signals $\overline{\text{CS}}$, $\overline{\text{RAS}}$, $\overline{\text{CAS}}$, $\overline{\text{WE}}$, DSF on terminals 340C are provided to input buffers 420. Each input buffer converts its respective input signal from the TTL to CMOS levels and also inverts the signal. The inverted signals CS, RAS, CAS, WE are NAND'ed by four-input NAND gate 424. The inverted signal $\overline{\text{DSF}}$ is inverted again by inverter 428. The outputs of NAND gate 424 and inverter 428 are NOR'ed by two-input NOR gate 430. The output of gate 430 is high if, and only if, all the signals on terminals 340C are low.

The output of gate 430 is connected to the D (data) input of data flip flop 432. The D input signal propagates to the Q output of the flip flop on each rising edge of internal clock MCLK. The signal on output Q is the MRS (mode register set) command signal. The high MRS signal causes the loading of mode register 360.

Figure 2:
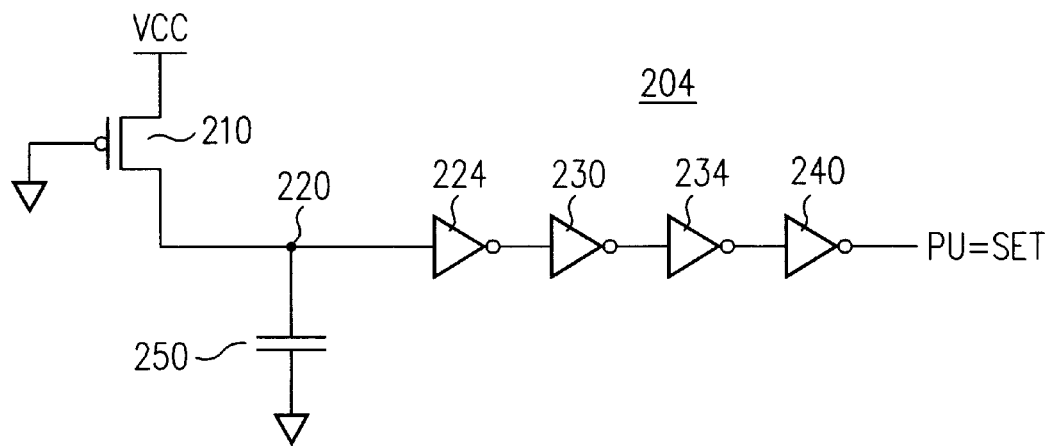
FIG. 2 is a circuit diagram of a prior art circuit that generates an initialization signal for the latch of FIG. 1.

In some embodiments, the flip flop 432 has an asynchronous Clear input (not shown) receiving a signal $\overline{\text{PU}}$. The signal $\overline{\text{PU}}$ is provided by a CMOS inverter (not shown) which inverts the power up signal PU of FIG. 2. Initially $\overline{\text{PU}}$ is low on power-up, but then the inverter charges $\overline{\text{PU}}$ to VCC. This causes the flip flop output MRS to be low. Later, when PU becomes high, $\overline{\text{PU}}$ becomes low, allowing the latch to respond to its data and MCLK input.

The signal MRS is inverted by inverter 440. The output of inverter 440 is connected to the SET input of latch 110.

FIG. 5 (consisting of FIGS. 5A–5F) illustrates latch 110 initialization timing. At some time t0 (FIG. 5A), the power is turned on. Then a predetermined pause D1 (100 μs in some embodiments) is allowed to elapse. By the end of pause D1, the clock enable CKE becomes high, enabling the internal clock MCLK (FIG. 5B). By the end of the pause, VCC has reached its final value, and thus the latch 110 can be initialized reliably.

After the pause D1, a "precharge all banks" command is performed. This is a standard command specified by the JEDEC standard for the SGRAMs. Commands on terminals 340C are shown as CMD in FIG. 5C. The precharge all banks command signal is provided on terminals 340C shortly before a rising edge E1 of clock MCLK. The command signal is ($\overline{CS}$, $\overline{RAS}$, $\overline{CAS}$, $\overline{WE}$, DSF)=(L, L, H, L, L), as specified by the JEDEC standard. L stands for low and H stands for high. The command is performed starting at the clock cycle edge E1. (Each clock cycle starts on a rising edge of the clock CK and hence on the rising edge of MCLK since MCLK=CK when MCLK is enabled by CKE.) Since the command on terminals 340C is different from MRS, the MRS output of flip flop 432 (FIG. 4) is low (FIG. 5D). Hence the SET signal (FIG. 5E) is high.

In some embodiments, the "precharge all banks" command is replaced by a sequence of "precharge select bank" commands that precharge all the memory banks.

Once the precharge command is completed, a minimum time period tRP (21 ns in some embodiments) is allowed to elapse, and then the mode register set command is issued. The MRS command is provided on terminals 340C shortly before a rising edge E2 of clock MCLK. This means all the terminals 340C are driven low. On the edge E2, the MRS output of flip flop 432 (FIG. 5D) becomes high, and signal SET (FIG. 5E) becomes low. The output OUT of latch 110 becomes high (FIG. 5F).

A minimum time period tRSC (20 ns in some embodiments) is allowed to elapse after the clock cycle beginning on edge E2. Then two auto refresh commands are performed on two subsequent clock cycles starting on respective rising edges E3, E4 of clock MCLK. For auto refresh, ($\overline{CS}$, $\overline{RAS}$, $\overline{CAS}$, $\overline{WE}$, DSF)=(L, L, L, H, L). Therefore, on the rising edge E3, the MRS output of flip flop 432 becomes low, and SET becomes high. The output OUT of latch 110 assumes a state indicting the state of fuse F1. The latch initialization is now completed.

The SET signal can also become low during the time period tRSC between the MRS and auto refresh commands if the MRS signal is removed from terminals 340C and another signal is latched by flip flop 432 during that period.

In some embodiments, the entire initialization waveform of signal SET (i.e. the low level, the subsequent rising edge, and the subsequent high level) is generated in response to the MRS command signal or in response to a rising edge or a high level of the MRS output of flip flop 432.

Some memory data sheets specify that after the mode register is programmed, some time period must elapse before another command can be issued. This helps to ensure that by the time the command following the MRS command is performed, the latch 110 has been initialized and any circuits controlled by the latch in block 320 (FIG. 3) have stabilized. In other embodiments, the time period after the MRS command is not provided. A memory access can be performed immediately after the MRS command. A memory access may start with a bank activate command which causes the memory to latch a row address and active a respective word line. If the latch 110 is used for row decoding (for example, to substitute a defective row with a spare row of memory cells), the time it takes for the latch to assume its final state after the falling edge of signal SET and for the circuits controlled by the latch to stabilize, may be too long for the bank activate command to operate properly immediately after the MRS command. Therefore, in some embodiments the latch initialization circuitry of FIG. 4 is not used for latches that affect the row selection operation. However, since a greater period of time elapses before column selection, the FIG. 4 circuitry can be used safely for latches that control column selection (for example, for latches that control replacement of defective columns with spare columns). In some embodiments with an 8 ns clock cycle, the time it takes for the latch to assume its final state and for the circuits controlled by the latch to stabilize is under 6.5 ns. Since at least one full clock cycle (at least one command) occurs between the MRS command and a column selection command (examples of column selection commands are read and write), the FIG. 4 circuitry is safe to use with column selection circuitry.

In typical operation, the MRS command is performed only once, when the memory is initialized. Therefore, the SET input of latch 110 remains high for the duration of the memory operation. However, even if the MRS command is repeated, and the latch is thus re-initialized, the memory will operate properly because the memory arrays 330 are not accessed when the MRS command is performed. In particular, the output OUT of latch 110 is "don't care" when the MRS command is performed.

Some embodiments of memory 310 include multiple programmable latches 110 all of which are initialized by the same SET signal and/or in response to the same command or commands on terminals 340.

Non-MRS commands (for example, a precharge command) are used in some embodiments to generate the low level of the SET signal for one or more latches.

In some embodiments, the voltage VCC (FIG. 1) powering the latch 110 is a power supply voltage provided on an external pin; VCC also powers other parts of the integrated circuit 310. In other embodiments, the latch 110 is powered not by VCC but by a voltage developed internally by circuit 310 (for example, an internally developed power supply voltage IVCC). The minimum specified time period which must elapse between turning the power on and issuing the MRS command on terminals 340 is sufficient for the voltage powering the latch to reach a value at which the latch can be initialized reliably.

In some dynamic and non-dynamic memory embodiments, programmable latches 110 control spare row and column decoders 334 to select spare rows or columns, as described in U.S. Pat. No. 4,546,455 issued Oct. 8, 1985 to Iwahashi et al. and incorporated herein by reference. In some embodiments, the programmable latches are used to adjust delay times or select a clock signal, as described in U.S. Pat. No. 5,440,246 issued Aug. 8, 1995 to Murray et al. and incorporated herein by reference. In some embodiments, the latches 110 are used to salvage defective memories, as described in U.S. patent application Ser. No. 08/840,337 filed Apr. 28, 1997 by Li-Chun Li et al., now U.S. Pat. No. 5,889,414, issued on Mar. 30, 1999, and incorporated herein by reference. Some embodiments of latches 110 are used in non-memory circuits.

The invention is not limited by the embodiments described above. In particular, the invention is not limited by any particular number of terminals 340 or 340C, or by any particular structure of latch 110, command decoder 350, or any other circuit. Some embodiments do not have a clock enable signal or even a clock signal. Other embodiments include multiple clock signals. Further, the invention is not limited to any particular waveforms on the terminals 340. Thus, in some embodiments, a command is specified by variable (AC) voltage or current levels on one or more of the terminals 340C.

The invention is not limited by a latch initialization signal having the waveform of FIG. 5E. Thus, in some embodiments, a programmable latch is initialized by a falling edge of a latch initialization signal, or by some constant voltage or current level (high or low) of the signal, or by some other waveform. In some embodiments, a latch initialization signal includes plural one-bit signals on plural terminals.

In some embodiments, alternative commands or command sequences can be used to initialize the same latch.

The invention is not limited to any particular structure of fuse F1. In some embodiments, the fuse is laser programmable or electrically programmable. Antifuses are used instead of fuses in some embodiments. Other embodiments use EPROM, EEPROM, or UPROM cells described in B. Prince, "Semiconductor Memories" (1991), pages 762–764 incorporated herein by reference, or some other non-volatile programmable elements. Further, the invention is not limited to a latch using a single non-volatile element. Other embodiments and variations are within the scope of the invention, as defined by the appended claims.

We claim:

1. An apparatus comprising:
   a non-volatile programmable latch including one or more non-volatile programmable elements whose state or states define a state of the latch, the latch being responsive to a latch initialization signal that causes the latch to assume said state of the latch;
   a circuit for performing a first initialization operation in the apparatus; and
   one or more terminals for receiving a first signal in response to which the first initialization operation is performed, and also for receiving one or more other signals in response to which one or more other operations are performed by the apparatus;
   wherein at least a portion of the latch initialization signal is generated in response to the first signal.

2. The apparatus of claim 1 wherein the first signal is to be provided to the one or more terminals after the latch is powered up.

3. The apparatus of claim 1 wherein said circuit comprises a register, and the first initialization operation comprises writing said register with a parameter defining operation of the apparatus.

4. The apparatus of claim 1 wherein:
   the apparatus comprises a synchronous dynamic random access memory which comprises:
      one or more memory arrays whose access is controlled by the latch; and
      a register; and
   the first initialization operation writes said register.

5. The apparatus of claim 4 wherein the register is a mode register.

6. The apparatus of claim 1 wherein:
   a first portion of the latch initialization signal is generated in response to the first signal; and
   a second portion of the latch initialization signal is generated when the first signal has been removed from the one or more terminals, wherein the latch is initialized in response to at least the first and second portions of the latch signal.

7. The apparatus of claim 6 wherein the second portion of the latch initialization signal is generated in response to the one or more terminals receiving a second signal in response to which the apparatus is to perform an operation other than the first initialization operation.

8. The apparatus of claim 6 wherein the first portion of the latch initialization signal comprises a first level of the latch initialization signal, and the second portion of the latch initialization signal comprises a second level of the latch initialization signal.

9. A method for operating an apparatus which is to be initialized by at least a first initialization operation, wherein the apparatus comprises a non-volatile programmable latch for controlling operation of the apparatus, the programmable latch including one or more non-volatile programmable elements whose state or states define a state of the latch, the latch being responsive to a latch initialization signal that causes the latch to assume said state of the latch, the method comprising:
   receiving on one or more terminals a first signal in response to which the apparatus is to perform the first initialization operation, wherein the one or more terminals are also for receiving one or more other signals in response to which one or more other operations are performed by the apparatus;
   performing the first initialization operation in response to the first signal; and
   generating at least a portion of the latch initialization signal in response to the first signal.

10. The method of claim 9 further comprising before receiving the first signal, allowing a voltage powering the latch to reach a value at which the latch can be initialized reliably.

11. The method of claim 10 wherein:
    the latch is initialized in response to at least a first portion and a second portion of the latch initialization signal;
    generation of at least a portion of the latch initialization signal in response to the first signal comprises generating the first portion of the latch initialization signal in response to the first signal; and
    the method further comprises generating the second portion of the latch initialization signal when the first signal has been removed from the one or more terminals.

12. The method of claim 11 wherein the second portion of the first signal is generated in response to the one or more terminals receiving a second signal in response to which the apparatus performs an operation other than the first initialization operation.

13. The method of claim 11 wherein the first portion comprises a fist level of the latch initialization signal, and the second portion comprises a second level of the latch initialization signal.

14. The method of claim 9 wherein:
    the apparatus comprises a synchronous dynamic random access memory which comprises one or more memory arrays; and
    the first initialization operation writes a register of said memory.

15. The method of claim 14 wherein the register is a mode register.

16. The method of claim 9 wherein the first signal includes plural signals on plural terminals.

17. An integrated circuit comprising a memory comprising:
    a block comprising one or more memory arrays, one or more address decoders, and a register which is to be initialized before the one or more memory arrays are accessed;

a non-volatile programmable latch including one or more non-volatile programmable elements whose state or states define a state of the latch, the latch having an output connected to said block, the latch having an input for receiving a latch initialization signal;

one or more terminals for receiving commands, one of the commands being a command to write the register; and a command decoder having one or more inputs connected to the one or more terminals and having an output connected to the input of the programmable latch.

18. The integrated circuit of claim 17 wherein the integrated circuit is a synchronous dynamic random access memory, and the register is a mode register.

19. The integrated circuit of claim 18 wherein memory is a synchronous graphics random access memory.

20. The apparatus of claim 17 wherein the register is to be initialized with a burst length before the one or more memory arrays are accessed.

21. The apparatus of claim 17 wherein the register is to be initialized with a $\overline{CAS}$ latency before the one or more memory arrays are accessed.

22. The apparatus of claim 17 wherein the command decoder generates the latch initialization signal in response to the command to write the register.

23. An apparatus comprising:

a non-volatile programmable latch responsive to a latch initialization signal that causes the latch to assume a predesignated state upon power up, the latch retaining the predesignated state throughout normal operation of the apparatus; and a circuit having one or more input terminals for receiving command signals, wherein upon power up the circuit generates the latch initialization signal in response to one or more command signals received at the one or more input terminals.

24. The apparatus of claim 23 wherein the one or more command signals are to be provided to the one or more input terminals after the latch is powered up.

25. The apparatus of claim 23 wherein the circuit comprises a register, and upon receiving a command signal used to generate the latch initialization signal the circuit writes said register with a parameter defining operation of the apparatus.

26. The apparatus of claim 23 wherein the latch assumes the predesignated state in response to the latch initialization signal making a transition from a first logic state to a second logic state.

27. An integrated circuit comprising:

a memory;

a non-volatile programmable latch for controlling the access to the memory, the latch being responsive to a latch initialization signal that causes the latch to assume a predesignated state upon power up, the latch retaining the predesignated state in each read and write access to said memory; and a circuit having one or more input terminals for receiving command signals, wherein upon power up the circuit generates the latch initialization signal in response to one or more command signals received at the one or more input terminals.

28. A method for operating an apparatus having one or more terminals, wherein the apparatus comprises a non-volatile programmable latch for controlling operation of the apparatus, the method comprising:

upon power up, providing one or more command signals on the one or more terminals; and the apparatus generating a latch initialization signal in response to the one or more command signals, for causing the latch to assume a predesignated state, the latch retaining the predesignated state throughout normal operation of the apparatus.

29. The method of claim 28 further comprising before providing the one or more command signals, allowing a voltage powering the latch to reach a value at which the latch can reliably assume the predesignated state.

30. The method of claim 28 wherein the generating step comprises:

receiving a first command signal at the one or more terminals, for causing the latch initialization signal to assume a first logic state; and receiving a second command signal at the one or more terminals, for causing the latch initialization signal to assume a second logic state, wherein the latch assumes the predesignated state in response to the latch initialization signal making a transition from the first logic state to the second logic state.

* * * * *